(12) United States Patent
Chun et al.

(10) Patent No.: US 6,607,983 B1
(45) Date of Patent: Aug. 19, 2003

(54) METHOD OF PROCESSING A DEFECT SOURCE AT A WAFER EDGE REGION IN A SEMICONDUCTOR MANUFACTURING

(75) Inventors: Kwang-Youl Chun, Sungnam (KR); Yun-Jae Lee, Seoul (KR); Won-Seong Lee, Seoul (KR); Jeong-Hoon Oh, Seoul (KR); Kyu-Hyun Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/707,353

(22) Filed: Nov. 6, 2000

(30) Foreign Application Priority Data

Nov. 5, 1999 (KR) .......................... 99-48933

(51) Int. Cl.$^7$ .......................................... H01L 21/461
(52) U.S. Cl. ...................................... 438/691
(58) Field of Search ................ 438/652, 688, 438/637, 586, 691

(56) References Cited

U.S. PATENT DOCUMENTS 5,966,628 A * 10/1999 Wei et al. ................. 438/584
6,211,086 B1 * 4/2001 Lee et al. ................. 438/672
6,214,722 B1 * 4/2001 Lin et al. ................. 430/312
6,218,294 B1 * 4/2001 Lin et al. ................. 438/302
6,358,793 B1 * 3/2002 Yates et al. ............... 438/253

OTHER PUBLICATIONS

Itoh et al., "The Cleaning at a Back Surface and Edge of a Wafer for Introducing Cu Metallization Process" IEEE Aug. 2000, vol. 13, pp 300–304.*

* cited by examiner

Primary Examiner—William David Coleman
(74) Attorney, Agent, or Firm—Msrger Johnson & McCollom, P.C.

(57) ABSTRACT

The present invention provides a method of eliminating or covering a defect source in a wafer edge region for semiconductor fabrication. During the etching process of a sacrificial oxide layer for storage node openings, the sacrificial oxide layer has a rumple topology in the wafer edge region due to etching non-uniformity of a photoresist layer formed on the sacrificial oxide layer. Subsequent deposition of a conductive layer and planarization etching, the conductive layer undesirably remains at the wafer edge region as a defect source. Such conductive contaminant particles dislodge, causing many problems in the wafer main region. The present invention removes such a defect source via two methods. One is to directly remove the defect source using a photoresist pattern exposing thereof. The other is to fix the defect source in place in the wafer edge region by protecting thereof by a photoresist pattern during subsequent cleaning processes.

20 Claims, 12 Drawing Sheets

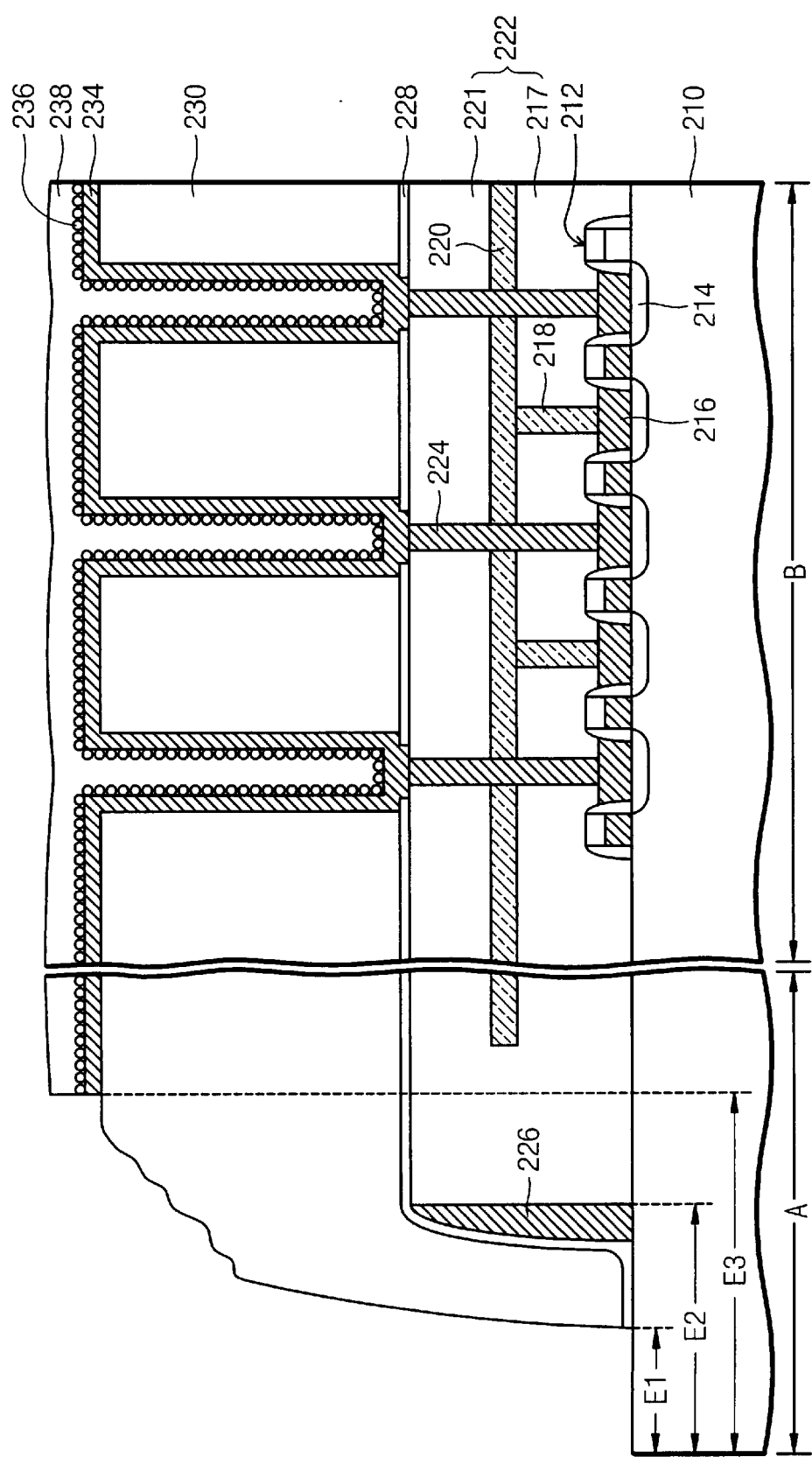

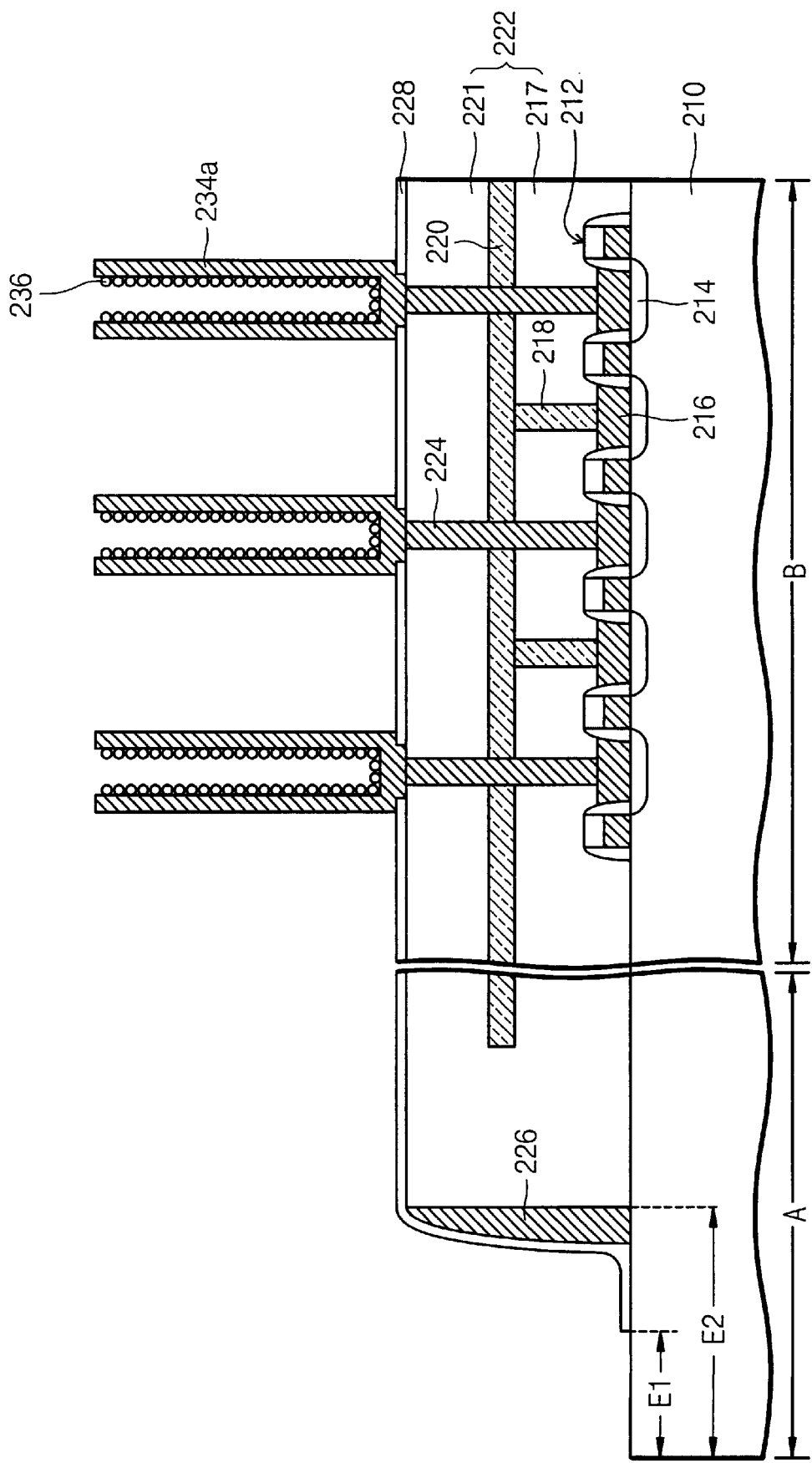

METHOD OF PROCESSING A DEFECT SOURCE AT A WAFER EDGE REGION IN A SEMICONDUCTOR MANUFACTURING

This application relies for priority upon Korean Patent Application No. 1999-48933, filed on Nov. 5, 1999, the contents of which are herein incorporated by reference in their entirety.

BACKGROUND OF THE INVENTION

1. Field of the Invention

The present invention relates to the field of semiconductor devices, and more particularly, to a method of processing a defect source in a wafer edge region.

2. Description of the Related Art

In semiconductor manufacturing, deposited layers from a wafer edge region at various processing stages dislodge contaminant particles, which intrude into a wafer main region where integrated circuit elements are formed, and become a defect source. Accordingly, an edge exposure of wafer (EEW) process is typically carried out to clean the deposited layers of the wafer edge region. The EEW process defines an EEW line at a predetermined region of the wafer edge region between the outermost wafer edge toward the center of the wafer, and etches the deposited layers between the EEW line and the outermost wafer edge (i.e., removes the layers outside of the EEW line). The position of the EEW line varies depending on the process stage when the cleaning occurs. For example, at the stage of storage node contact, bit line contact, and SAC (self-aligned contact) formation processes, the EEW line is defined at the wafer edge region at about 2.0 mm from the outermost of the wafer edge, and at the stage of a capacitor lower electrode formation process, the EEW line is at about 1.5 mm from the wafer edge.

As an integrated circuit memory device becomes highly integrated, integrated circuit elements such as a capacitor become smaller and smaller in size. This results in a decrease in capacitance because the area occupied by the capacitor electrode also decreases. In order to increase the effective area occupied by the capacitor (i.e., to increase capacitance) in a given cell area under recent miniaturization trends of the semiconductor industry, a cylindrical type capacitor storage electrode is being widely employed.

FIG. 1 is a cross-sectional view of a semiconductor wafer showing a rumple surface D of a wafer edge region and particles thereon in the process of manufacturing a cell capacitor storage node, which edge surface D is the focus of the present invention.

Referring to FIG. 1, a source/drain region 112 and a gate electrode 114 are formed on a wafer 110. Contact pads 116 and bit line contact plugs 118 are formed above the source/drain region 112. Bit lines 120 are formed to be electrically connected to contact pads 116 via bit line contact plugs 118. A first insulating layer 124 is formed thereon and storage node contact plugs 122 are formed in the first insulating layer 124 to be electrically connected to contact pads 117. Through a first EEW process, a first EEW line (at distance E2, approximately 2.0 mm from the outermost of the wafer edge) is defined in a wafer edge region (A), and a portion of the first insulating layer outside of the first EEW line is etched away.

A silicon nitride layer 126 is formed on the resultant structure. A sacrificial oxide layer 128 is then formed on the silicon nitride layer 126. A second EEW process is performed. The second EEW process defines a second EEW line (at distance E1, about 1.5 mm from the outermost wafer edge) in the wafer edge region (A). Accordingly, the sacrificial oxide layer 128 and the silicon nitride layer 126 outside of the second EEW line (between the second EEW line and the outermost of the wafer edge) are etched away.

Through a photo-etching process, the sacrificial oxide layer 128 is patterned to form an opening therein, exposing the storage node contact plug 122. Since the topology of sacrificial oxide layer 128 slopes toward the outermost of the wafer edge at the wafer edge region (causing a step at the wafer edge region) due to the first and second EEW processes, a photoresist layer (not shown) is deposited unevenly over the sacrificial oxide layer 128 and is deposited relatively thin at the wafer edge region (A). As a result, during the photo-etching process, the photoresist layer at the step portion of the wafer edge region (A) is also etched away, thereby exposing a region of the sacrificial oxide layer 128. This undesirable etching of the exposed sacrificial oxide layer 128 causes a rumple surface D in the wafer edge region (A).

After removing the photoresist layer, a conductive layer 130 is then formed on the sacrificial oxide layer 128 and within the storage node opening. HSG silicon 134 is formed on the conductive layer 130 as shown. A second insulating layer 136 is formed on the resultant structure. The second insulating layer 136, HSG silicon 134 and the conductive layer 130 are planarized by etching until the sacrificial oxide layer 128 is exposed, to form a cell capacitor storage node. However, residues of HSG silicon 134 and the conductive layer 130 remain on the rumple surface D of the wafer edge region (A). Subsequently, wet etching is carried out to remove the second insulating layer 136 in the storage node opening and the sacrificial oxide layer 128. However, during this wet etching, residues of HSG silicon 134 and the conductive layer 130 may be dislodged from the rumple region to drift freely, thereby becoming a serious source of contamination. Such conductive particles can cause shorts and device failures.

SUMMARY OF THE INVENTION

The present invention was made in view of above-mentioned problems and it is an object of the present invention to provide a method of eliminating or covering a defect source in a wafer edge region for semiconductor fabrication.

It is a feature of the present invention that a photoresist layer pattern is formed to either expose or cover a defect source region at a rumple surface of a wafer edge region. If the defect source is exposed, the exposed defect source is removed from the rumple surface. If the defect source is covered by the photoresist layer pattern, the defect source is fixed in place and is protected by the photoresist layer pattern during a wet cleaning process, thereby preventing the defect source from dislodging to drift freely into a wafer main region.

In accordance with the present invention, there is provided a method of eliminating or covering a defect source in a wafer edge region, the wafer being defined by the wafer edge region and a wafer main region. The method includes forming an insulating layer on a surface of the wafer. The insulating layer in the wafer edge region is damaged during a subsequent process, and conductive contaminants undesirably remain thereat during subsequent deposition of a conductive layer and planarizing processes. A photoresist layer is formed on the resultant structure having the conductive contaminants. The photoresist layer is then patterned to expose either the wafer edge region or the wafer main region.

The wafer edge region is defined as a ring shaped region with a predetermined width from the outermost part of the wafer edge where integrated circuit elements normally operating do not exist.

In accordance with the present invention, there is provided a method of processing a defect source in a wafer edge region. The method includes forming a first insulating layer on the wafer. An edge exposure of wafer (EEW) line is defined at a predetermined region of the wafer edge region and the first insulating layer outside of the EEW line is removed. Namely, the first insulating layer between the EEW line and the outermost part of the wafer edge is removed. The first insulating layer is patterned to form an opening therein in the wafer main region. A conductive layer is formed on an entire surface of the wafer including the opening. A second insulating layer is formed on the resultant structure having the opening. A photoresist layer is formed on the second insulating layer. A selected part of the photoresist layer in the wafer edge region is removed through an EEW process. An EEW line for removing the photoresist layer is at the wafer edge region nearer to the wafer main region than the EEW line for removing the first insulating layer. The exposed second insulating layer in the wafer edge region by the remnant photoresist layer is etched to expose the conductive layer. The remnant photoresist layer is removed. The exposed conductive layer in the wafer edge region is removed by using the second insulating layer as an etching mask. The second insulating layer and the conductive layer in the wafer main region are planarized until the first insulating layer is exposed.

Preferably, HSG silicon is formed on the conductive layer. The EEW line for removing the first insulating layer is formed at the wafer edge region of about 1.5 mm from the outermost part of the wafer. The EEW line for the removing the photoresist layer is formed at the wafer edge region of about 3.0 mm from the outermost part of the wafer.

In accordance with the present invention, there is provided a method of processing a defect source at a wafer edge region in a semiconductor manufacturing, the wafer being defined by the wafer edge region and a wafer main region. The method includes forming a first insulating layer on the wafer having transistors, bit lines, and contact plugs. An EEW line is defined at the wafer edge region from an outermost part of the wafer edge. The first insulating layer outside of the EEW line is removed. A first photoresist pattern is formed on an entire surface of the wafer. The first insulating layer is patterned to form opening for a storage node therein in the wafer main region by using the first photoresist pattern as an etching mask. The first photoresist pattern is removed. A conductive layer is formed on resultant structure having the opening. A second insulating layer is formed on the conductive layer. The second insulating layer and the conductive layer are planarized until the first insulating layer is exposed. A second photoresist layer is formed over the resultant structure. Another EEW line is defined at the wafer edge region and the second photoresist layer inside of the another EEW line is removed. Namely, the second photoresist layer in the wafer main region.

The wafer edge region is a ring shaped region with a predetermined width from the outermost part of the wafer edge at which integrated circuit elements normally operating do not exist.

Preferably, the EEW line for removing the first insulating layer is formed at the wafer edge region of about 1.5 mm from the outermost part of the wafer edge. The another EEW line for removing the second photoresist layer is formed nearer to the wafer main region than the EEW line for removing the first insulating layer. The another EEW line for removing the second photoresist layer is formed at the wafer edge region of approximately 3.0 mm from the outermost part of the wafer. The conductive layer is made of a conductive material that has an etching selectivity of at least 5:1 with respect to the first and second insulating layer.

BRIEF DESCRIPTION OF THE DRAWINGS

The above features and advantages of the invention will become apparent upon reference to the following detailed description of specific embodiments and the attached drawings, of which:

FIGS. 2A through 2G schematically shows a semiconductor wafer at selected stages of processing a defect source at a wafer edge region according to first embodiment of the present invention.

DETAILED DESCRIPTION OF THE PREFERRED EMBODIMENTS

The preferred embodiment of the present invention will now be described with reference to the accompanying drawings.

The present invention relates to a method of processing a defect source at a wafer edge region. In accordance with the present invention, the defect source at the wafer region, especially at a step portion thereof, is removed therefrom or is fixed thereat.

The first embodiment concerns the removal of the defect source from the wafer edge region. In accordance with the first embodiment, first, a photoresist layer is formed on an entire surface of the wafer containing a defect source at the wafer edge region, then the photoresist layer is developed to expose a selected region of the wafer edge containing the defect source. The exposed defect source is then etched away.

With reference to FIGS. 2A through 2G, the first embodiment of the present invention is further described. FIGS. 2A through 2G schematically show in cross section a semiconductor wafer at selected stages of processing a defect source at the wafer edge region.

Figure 1:
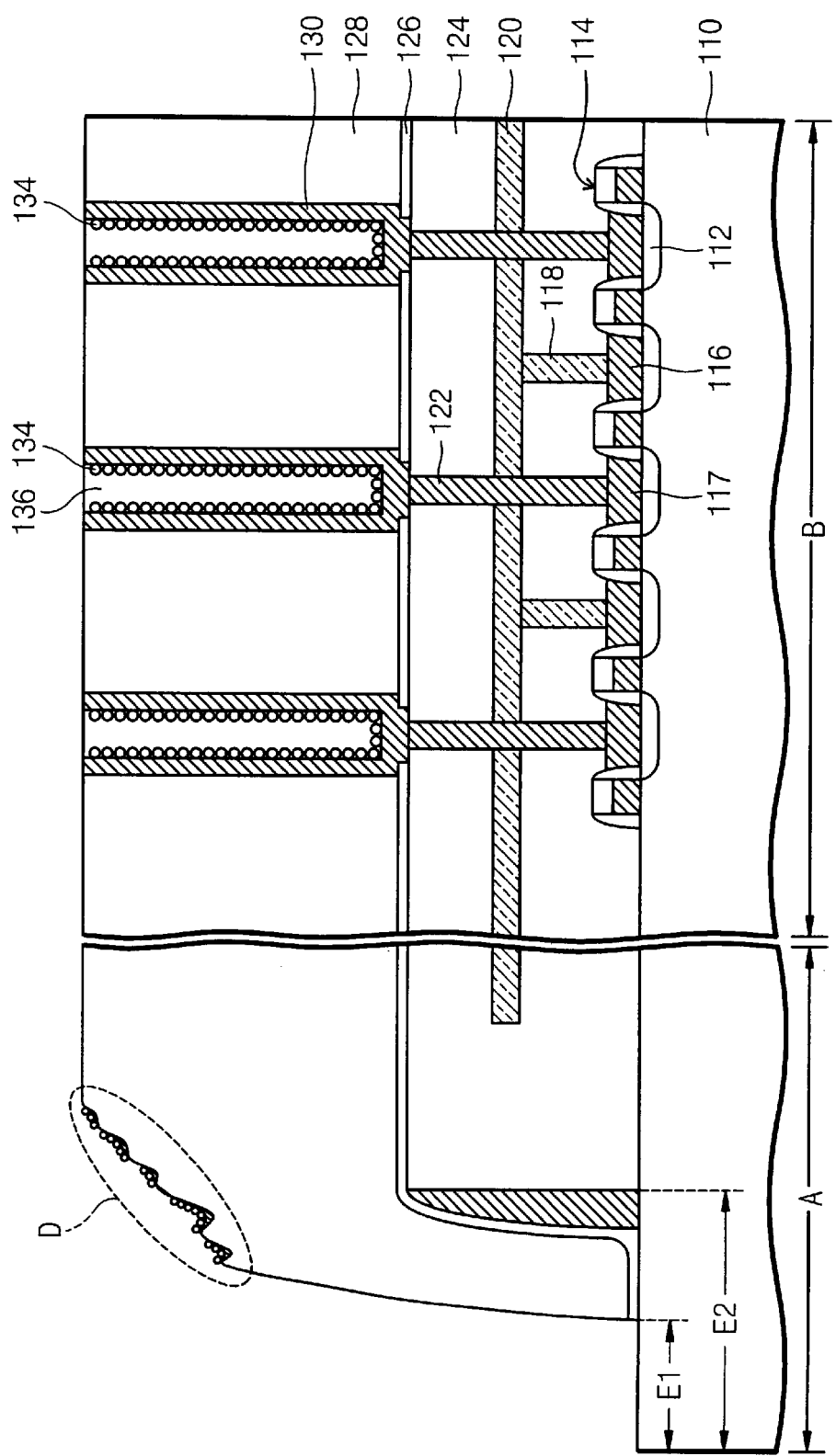
FIG. 1 is a cross-sectional view of a semiconductor wafer to show an uneven surface (rumple) of a wafer edge region and particles thereon in the process of manufacturing a cell capacitor.
Figure 2A:
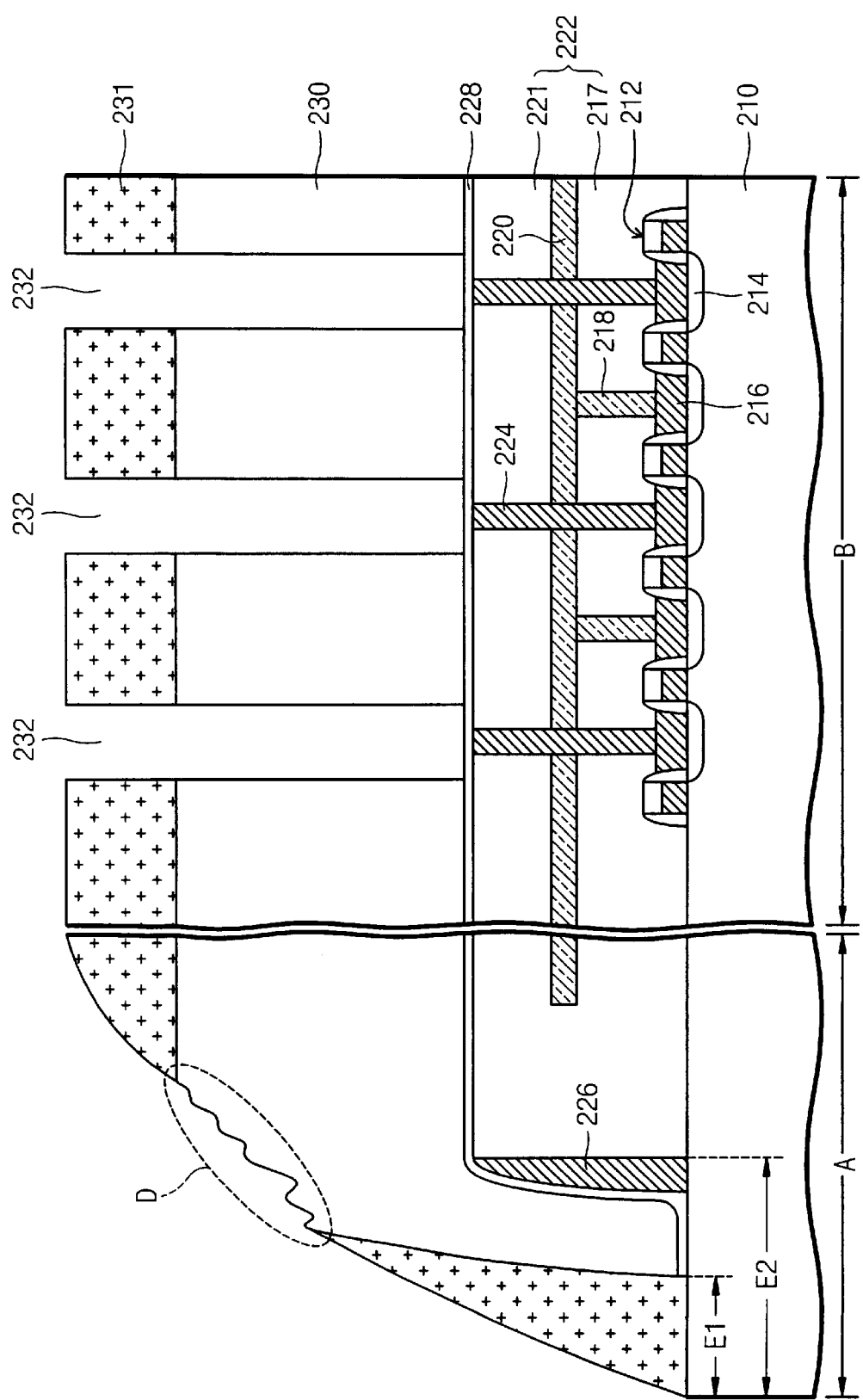

Referring now to FIG. 2A, a wafer edge region (A) and a wafer main region (B) are defined in a wafer 210. The wafer edge region (A) is a ring shaped region with a predetermined width measured from the outermost part of the wafer edge where, typically, there exist no operable integrated circuit elements. The other portion of the wafer 210 is the wafer main region (B) containing operable circuit elements. A transistor comprises a gate oxide (not shown), a gate electrode 212 and source/drain regions 214 formed on the wafer main region (B) using conventional techniques. A sidewall spacer is formed on the sidewall of the gate electrode 212. A contact pad 216 is formed on the wafer main region (B) between adjacent gate electrodes, the contact pads being self-aligned over the source/drain regions 214. A first insulator 217 is deposited over the resultant structure. Bit line contact plugs 218 are formed in the first insulator 217 by patterning the first insulator 217 to form a contact hole therein and filling the contact hole with a conductive material. Bit lines 220 are then formed on the first insulator 217 to be electrically connected to the bit line contact plugs 218. Another insulator 221 is formed on the insulator 217 and on the bit line 220.

For simplicity, another insulator 221 and the first insulator 217 are hereinafter referred to as a first interlayer insulating layer 222. The first interlayer insulating layer 222 can be formed of $O_3$-TEOS USG, BPSG or combinations thereof, or other suitable materials, by conventional techniques such as atmospheric pressure chemical vapor deposition (APCVD). An EEW line (at distance E2) is defined in the wafer edge region at approximately 2.0 mm measured from outermost part of the wafer edge, and the first interlayer insulating layer 222 between the outermost part of the wafer edge and the EEW line (at distance E2), i.e., a region outside of the EEW line, is removed by conventional techniques. The first insulating layer 222 is then patterned to form contact holes and filled with a conductive material to form storage node contact plugs 224.

During the bit line contact plug 218, bit line 220 and storage node contact plug 224 formation processes, the conductive material remains on the sidewall of the first interlayer insulating layer 222 forming a sidewall spacer 226. Such conductive sidewall spacer 226 can generate particles if the sidewall spacer 226 is not removed or secured in place. However, a silicon nitride layer 228 is formed on the resultant structure to a thickness of about 100 Å–500 Å, thereby securing the conductive sidewall spacer 226 on the sidewall of the first interlayer insulating layer 222. Alternatively, a silicon oxynitride layer can be used instead of the silicon nitride layer.

A sacrificial oxide layer 230 is formed on the silicon nitride layer 228. The sacrificial oxide layer 230 can be made of a material such as borophosphosilicate glass (BPSG), undoped silicon glass (USG), a combination thereof, or any other suitable material, and has a thickness of about 13000 Å. BPSG can be made by using a silane ($SiH_4$) source or a TEOS (tetraethylorthosilicate) source.

The EEW process is again carried out to define the EEW line (at distance E1) in the wafer edge region (A) at about 1.5 mm from the outermost part of the wafer edge, and to etch a part of the sacrificial oxide layer outside of the EEW line (at distance E1).

A first photoresist layer is formed on the sacrificial oxide layer 230. The sacrificial oxide layer in the wafer edge region slopes toward outermost part due to the EEW processes. Namely, the wafer edge region (A) has a step portion around the EEW line (at distance E1). Accordingly, the first photoresist layer is thin on the step portion as compared to the other portions. The photoresist layer is etched using the photo-etching process, to form a first photoresist pattern 231. Using the first photoresist pattern 231 as a mask, the sacrificial oxide layer 230 and the silicon nitride layer 228 are etched to form openings 232 therein, exposing the storage node contact plugs 224. However, since the first photoresist pattern 231 is very thin on the step portion of the wafer edge region, a region of the sacrificial oxide layer 230 at the step portion of the wafer edge region (A) is undesirably exposed before the opening 232 is completely formed. Accordingly, further etching to complete the formation of the opening 232 undesirably etches the exposed region of the sacrificial oxide layer 230 and causes a rumple surface D on the sacrificial oxide layer 230 in the wafer edge region.

Figure 2B:
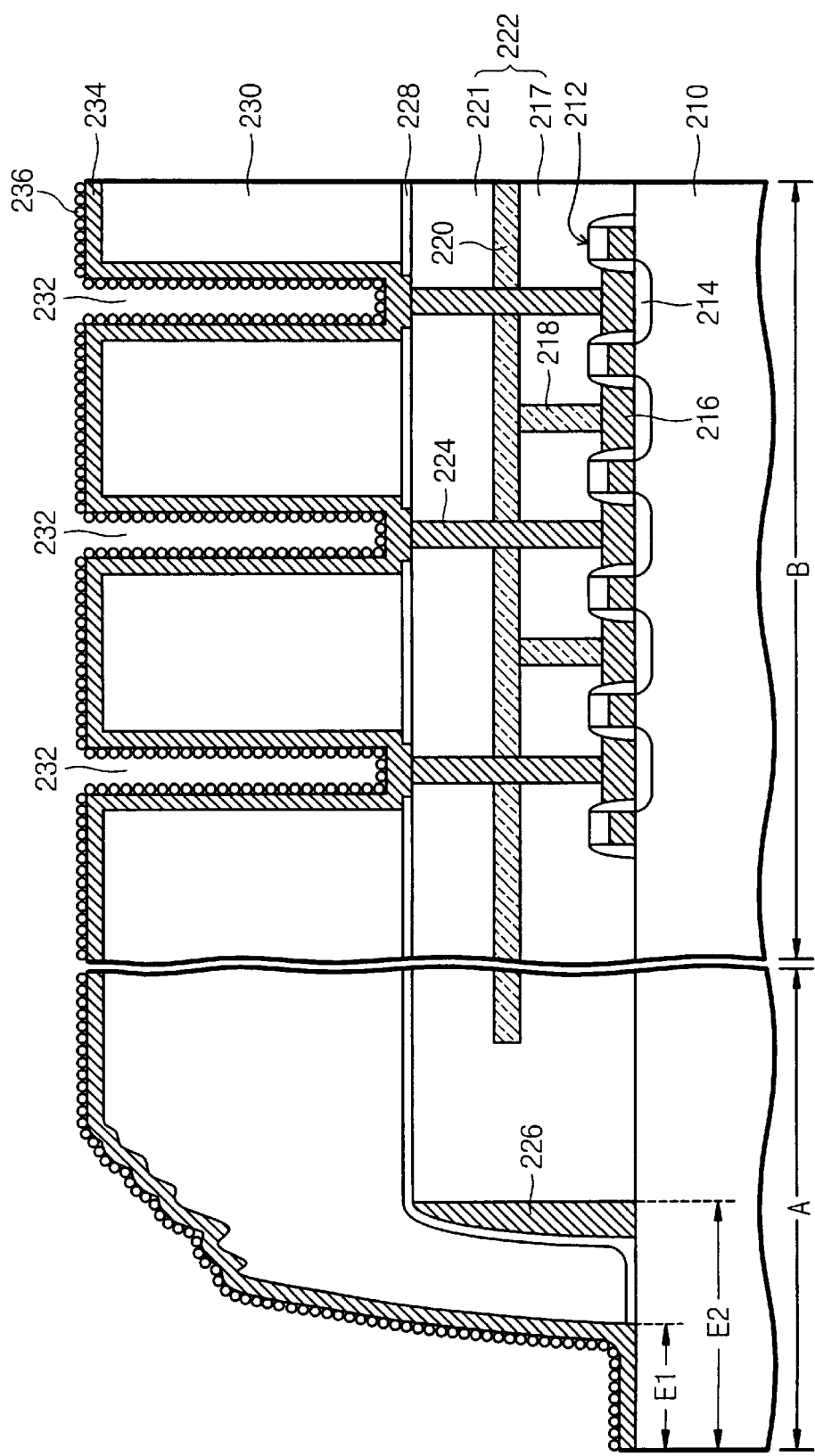

Referring now to FIG. 2B, after removing the first photoresist pattern 231, a conductive layer 234 as for a cell capacitor storage node is formed on the resultant structure having the opening 232. The conductive layer 234 can be formed of polysilicon or doped polysilicon. HSG silicon 236 is formed on the conductive layer 234 to increase available surface area.

Figure 2C:
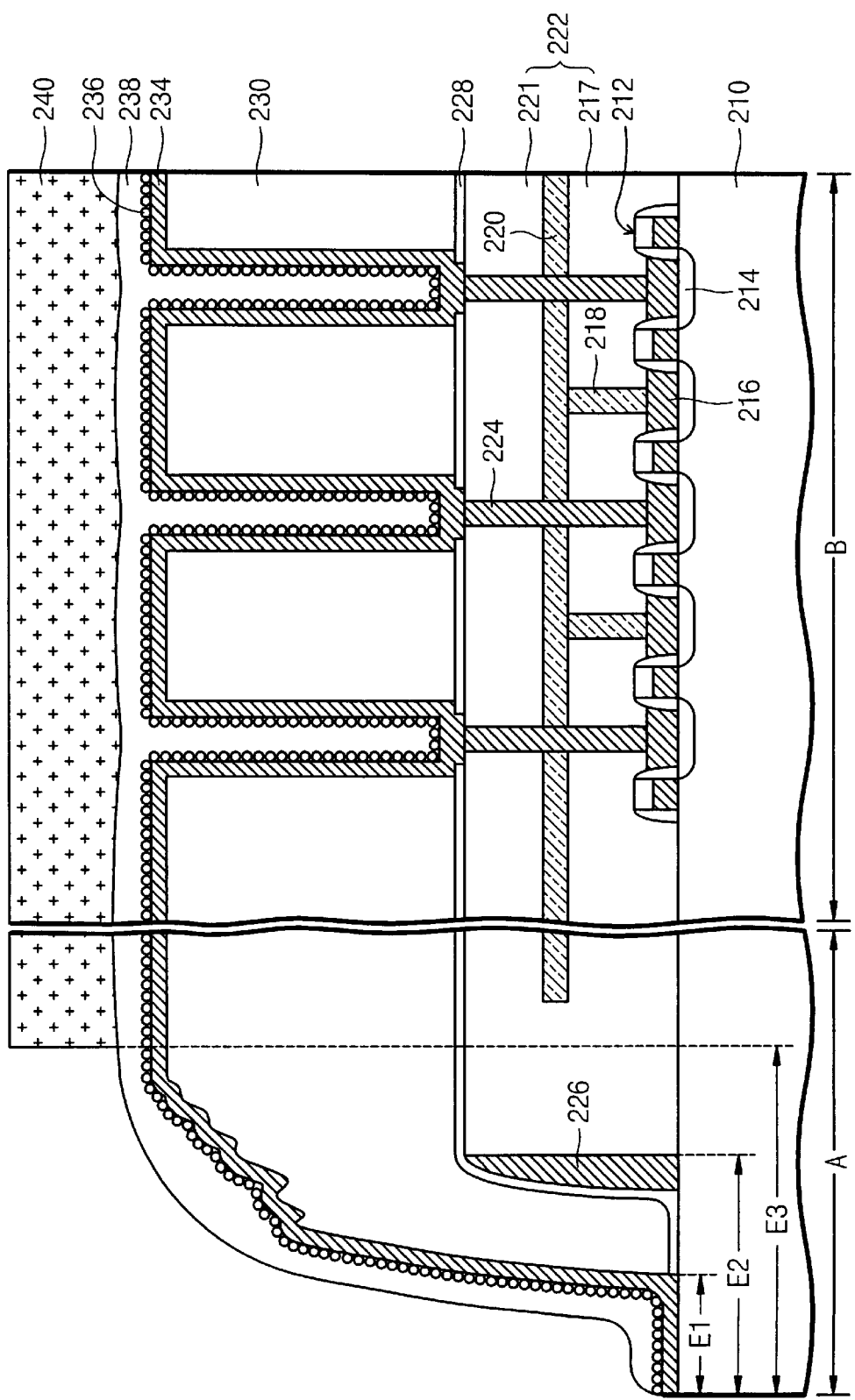

Referring to FIG. 2C, a second insulating layer 238 is formed on the conductive layer 234 and on the HSG silicon 236 to fill the openings 232. The second insulating layer 238 can be formed of oxide materials such as $SiO_2$, SiON, USG, BPSG, spin-on glass (SOG) materials, and high-density-plasma (HDP) CVD oxides. A second photoresist layer of the positive type is formed on the second insulting layer 238. The EEW process is carried out to define a EEW line (at distance E3) within a predetermined portion of the wafer edge region (A) at about 3 mm measured from the outermost part of the wafer edge, thereby forming a second photoresist pattern 240. Namely, only a region of the second photoresist layer outside of the EEW line (E3) is exposed to light and developed to form the second photoresist pattern 240 covering the wafer inside the EEW line (E3).

Figure 2D:
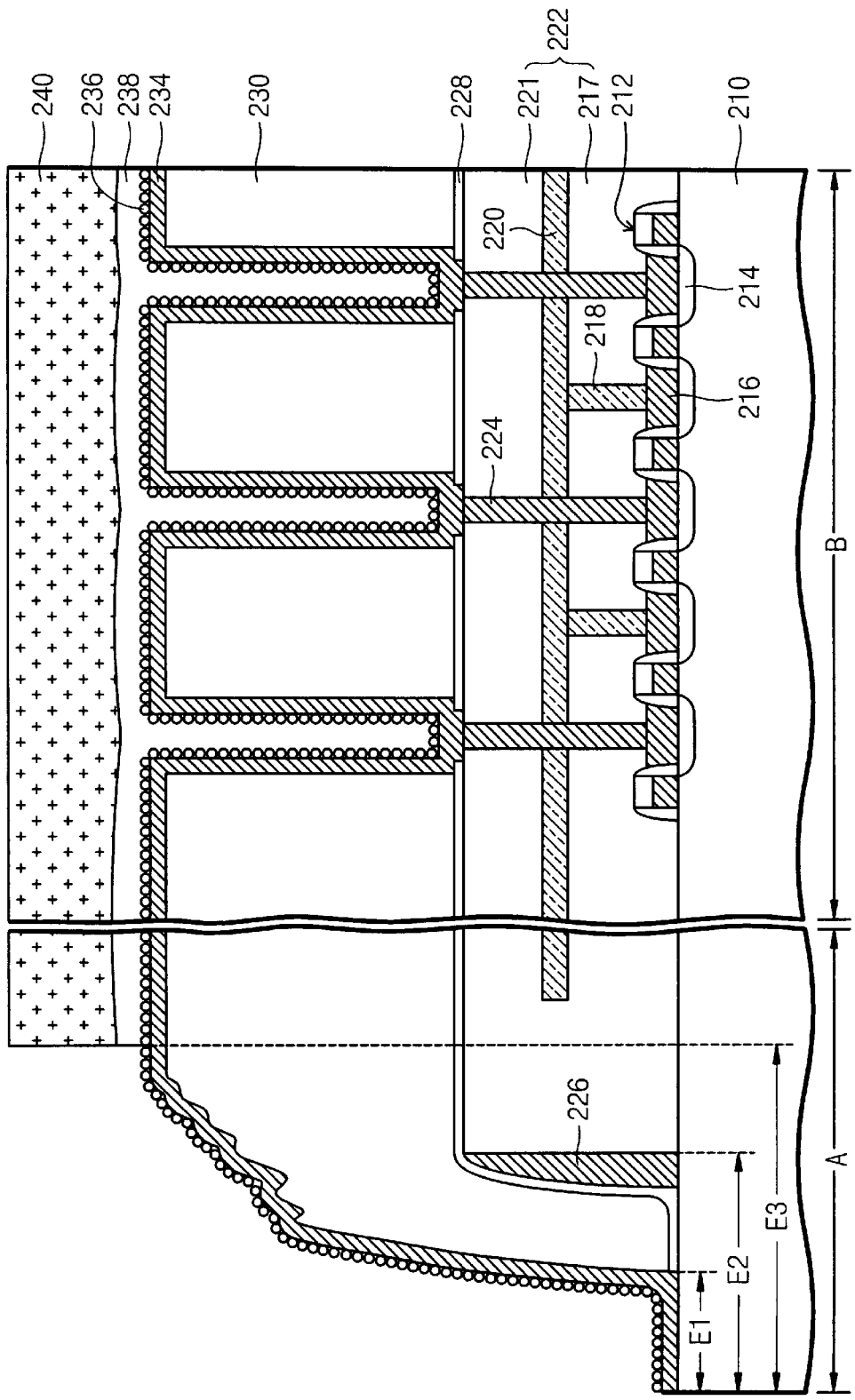

Referring to FIG. 2D, using the second photoresist pattern 240 as a mask, the exposed second insulating layer 238 outside of the EEW line (E3) is etched away to expose underlying HSG silicon and the conductive layer 234 at the step portion of the wafer edge region (A). The exposed second insulating layer 238 can be preferably etched away by using a DHF solution or a mixed solution of $NH_4F$ and HF.

Referring to FIG. 2E, after removing the second photoresist pattern 240, by using the second insulting layer 238 as a mask, HSG silicon and the conductive layer 234 on the step portion of the wafer edge region (A) are wet etched. This wet-etching preferably uses a mixed solution of HF, $HNO_3$, $CH_3COOH$ and DI water. It is preferable that the wet etching is controlled to selectively etch the conductive layer 234 with respect to the second insulating layer and the sacrificial oxide layer, at least 5:1, so as to avoid overetching of the conductive layer 234 at the wafer main region (B). As a result, a defect source, i.e., potential wafer contaminants, at the wafer edge region (A) can be substantially completely removed. Alternatively, the second photoresist pattern 240 can be used as an etching mask to remove the HSG silicon 236 and the conductive layer 234 on the step portion of the wafer edge region (A) without being removed prior to removal of the HSG silicon 236 and the conductive layer 234.

Figure 2F:
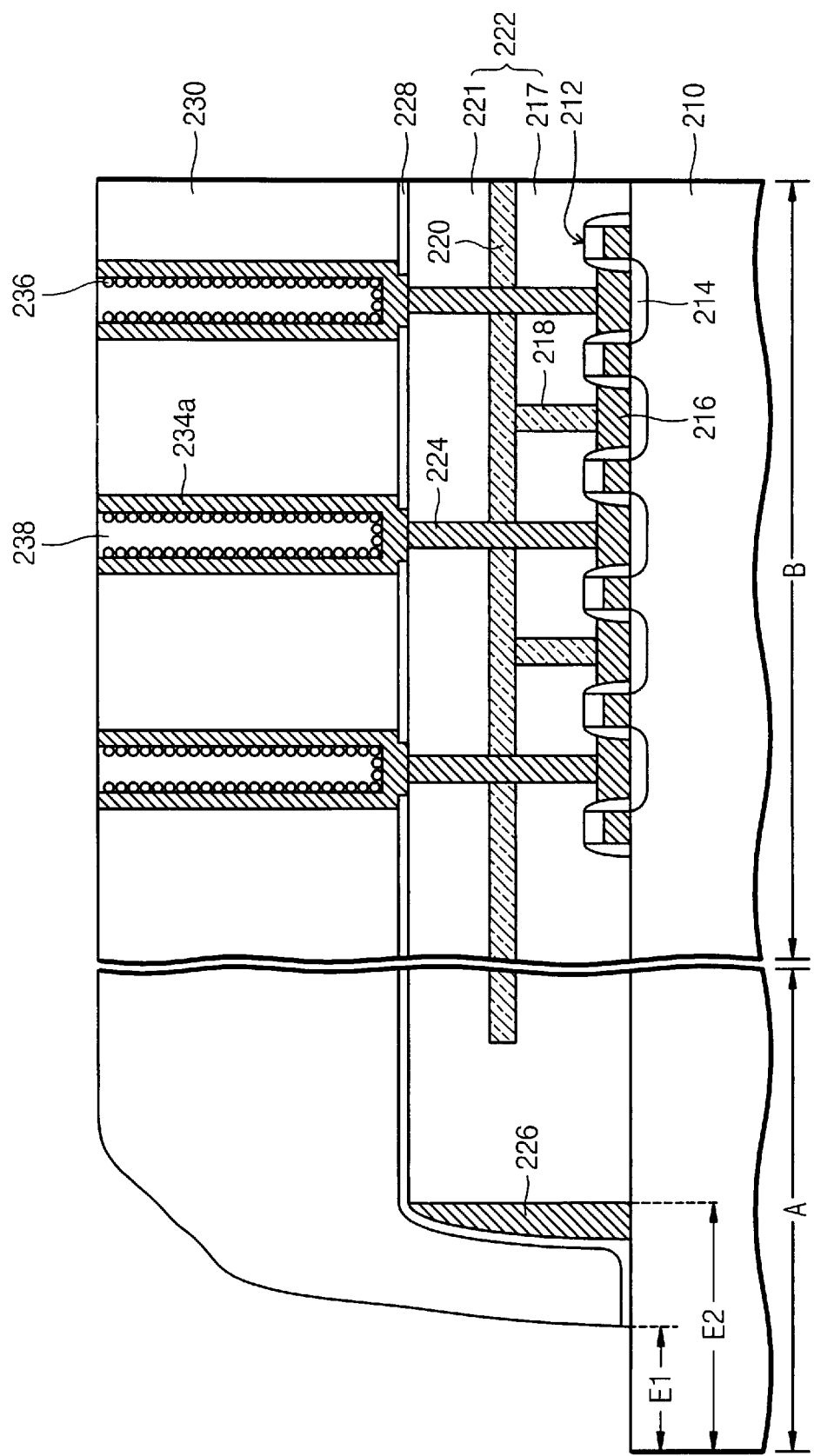

Referring to FIG. 2F, the second insulating layer 238, HSG silicon 236 and the remnant conductive layer 234 in the wafer main region (B) are planarized until the sacrificial oxide layer 230 is exposed, to form a capacitor storage node 234a. The planarization can be performed by using a CMP process or an etch back process. At this time, the rumple surface D is also slightly etched and thereby smoothed. Referring now to FIG. 2G, the second insulating layer 238 within the opening 232 and the sacrificial oxide layer 230 surrounding the storage node are removed to expose both outer and inner walls of the storage node. The sacrificial oxide layer 230 and the second insulating layer 238 can be removed preferably by using a DFH solution or a mixed solution of HF and $H_4F$. At this time, the silicon nitride layer 228 serves as a stopper layer.

Subsequently, a conventional dielectric process and a plate node process are carried out to form a cell capacitor, as is known.

With reference to FIGS. 3A to 3D, the second embodiment of the present invention is described. It is a feature of the second embodiment that a defect source is fixed in place where it is generated, i.e., in the rumple surface of the sacrificial oxide layer at the wafer edge region. In accordance with the second embodiment of the present invention, after forming a capacitor storage node isolated by a cell unit, a photoresist patterned is formed to cover a wafer edge region.

Figure 3A:
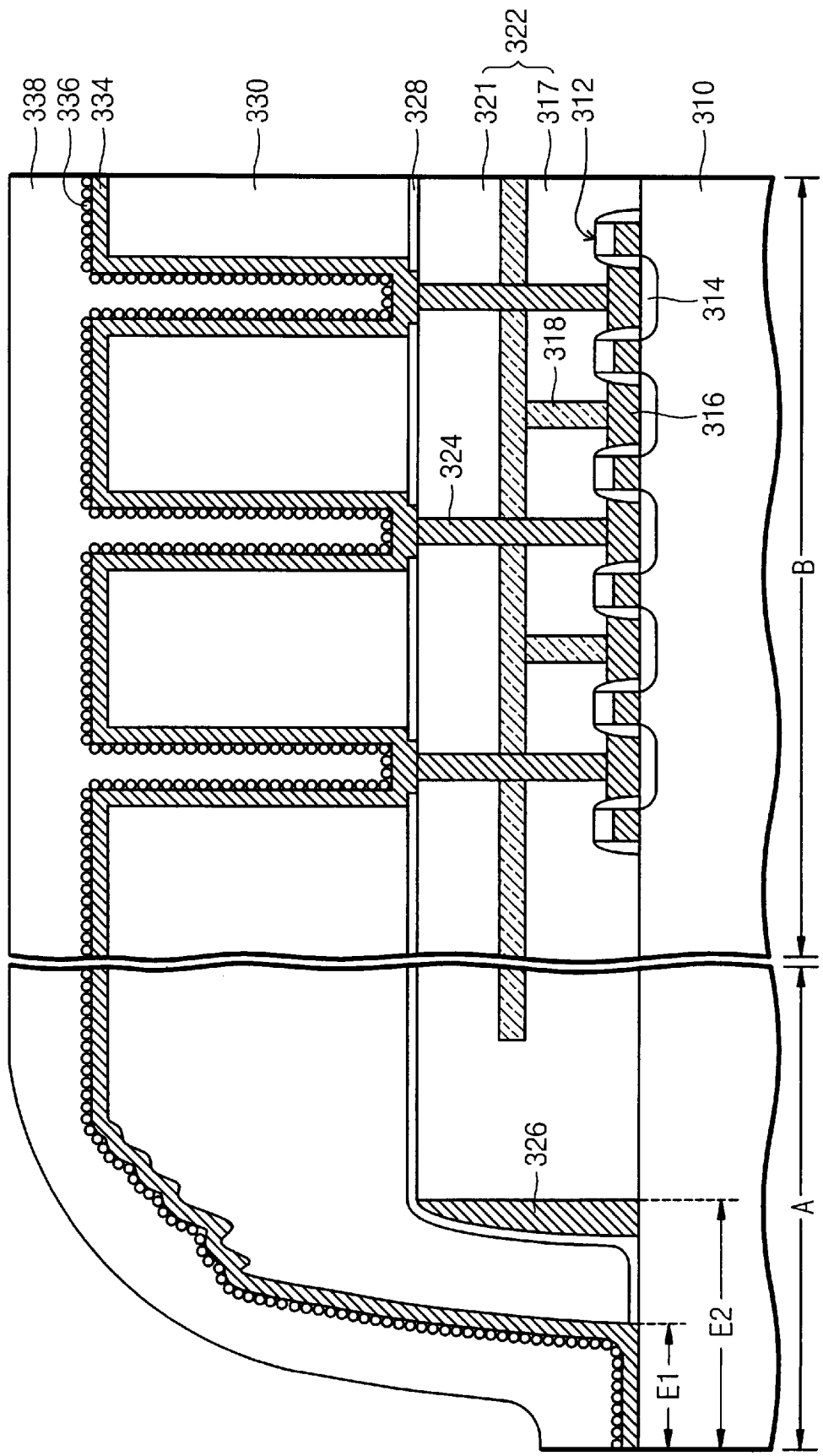
FIGS. 3A through 3D schematically shows a semiconductor wafer at selected stages of processing a defect source at a wafer edge region according to second embodiment of the present invention.

Referring to FIG. 3A, as in the first embodiment of the present invention shown in FIGS. 2A and 2B, a second insulating layer 338 is formed on HSG silicon 336 and a conductive layer 334. The second insulating layer 338 can be formed of oxide materials such as $SiO_2$, SiON, BPSG, USG, SOGs and HDP-CVD oxides.

Figure 3B:
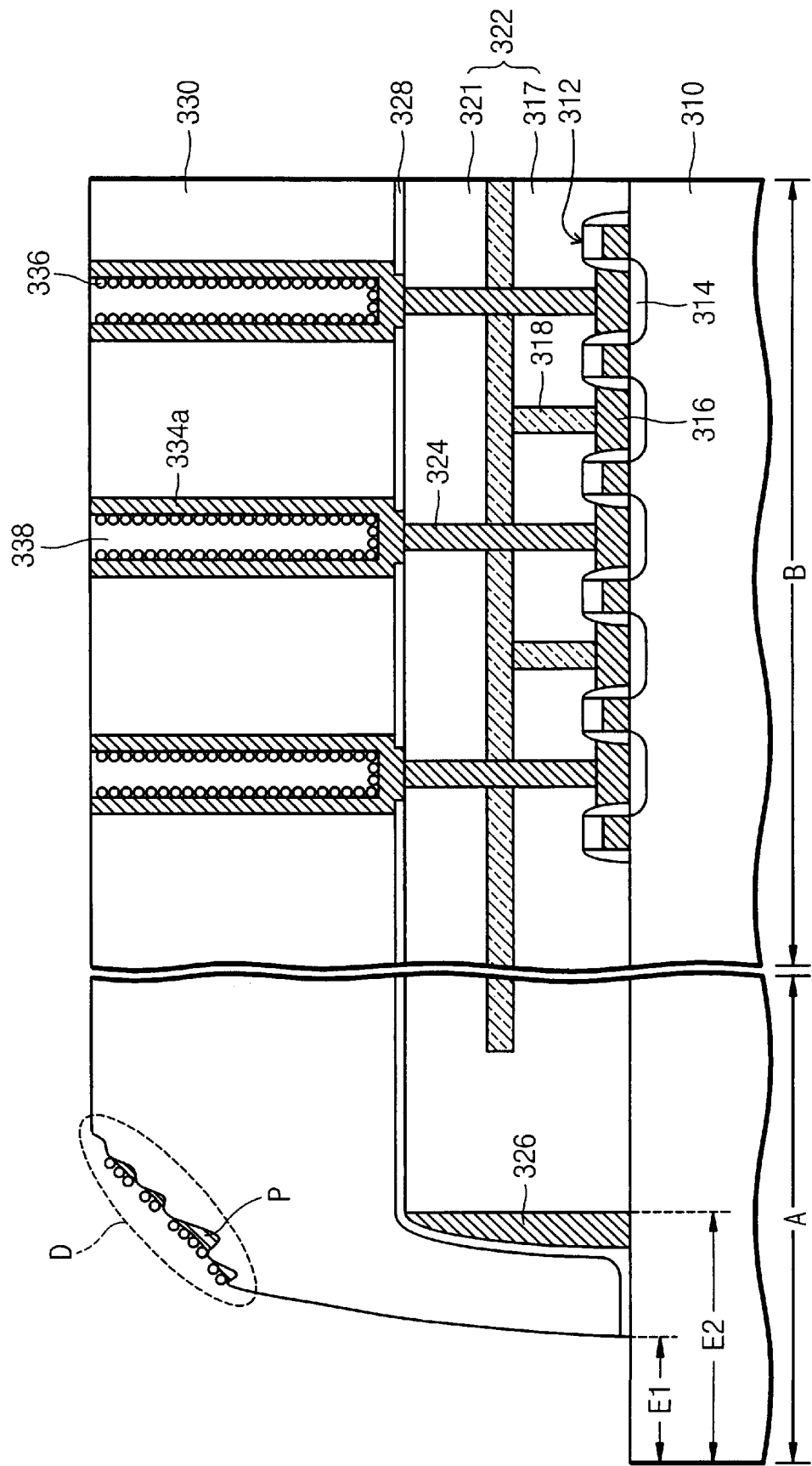

Referring to FIG. 3B, the second insulating layer 338, HSG silicon 336 and the conductive layer 334 are planarized until the sacrificial oxide layer 330 is exposed, to form a cell capacitor storage node 334a electrically isolated from adjacent storage nodes. The planarization can be performed by conventional techniques such as CMP or etch back processes. Due to the rumple surface D of the sacrificial oxide layer 330 in the wafer edge region (A), the HSG silicon 336 and the conductive layer 334 thereon are not completely etched, but remains thereat, generating particles P that may contaminate the wafer.

Figure 3C:
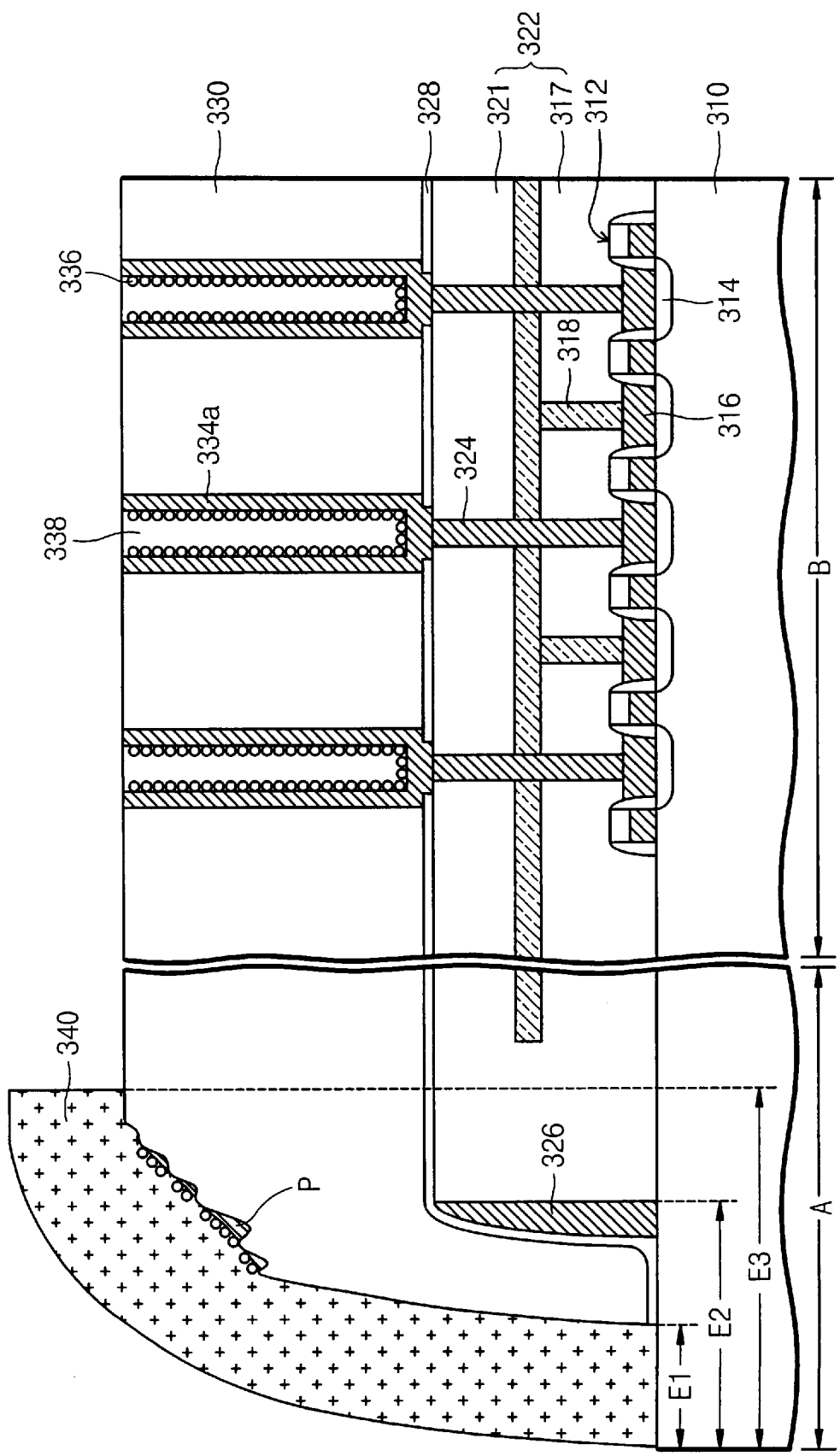

Referring to FIG. 3C, a second photoresist layer of positive type is deposited on the resultant structure. An EEW line (at distance E3) is defined in the wafer edge region (A) at about 3 mm measured from the outermost part of the wafer edge. The wafer main region and a portion of the wafer edge region, i.e. a region inside the EEW line (at distance E3), is exposed to light and developed to form a second photoresist pattern 340 covering the portion of the wafer edge region (A) outside of the EEW line (at distance E3). Accordingly, the particles (P) in the rumple surface D can be secured in place thereat due to the second photoresist pattern 340.

Figure 3D:
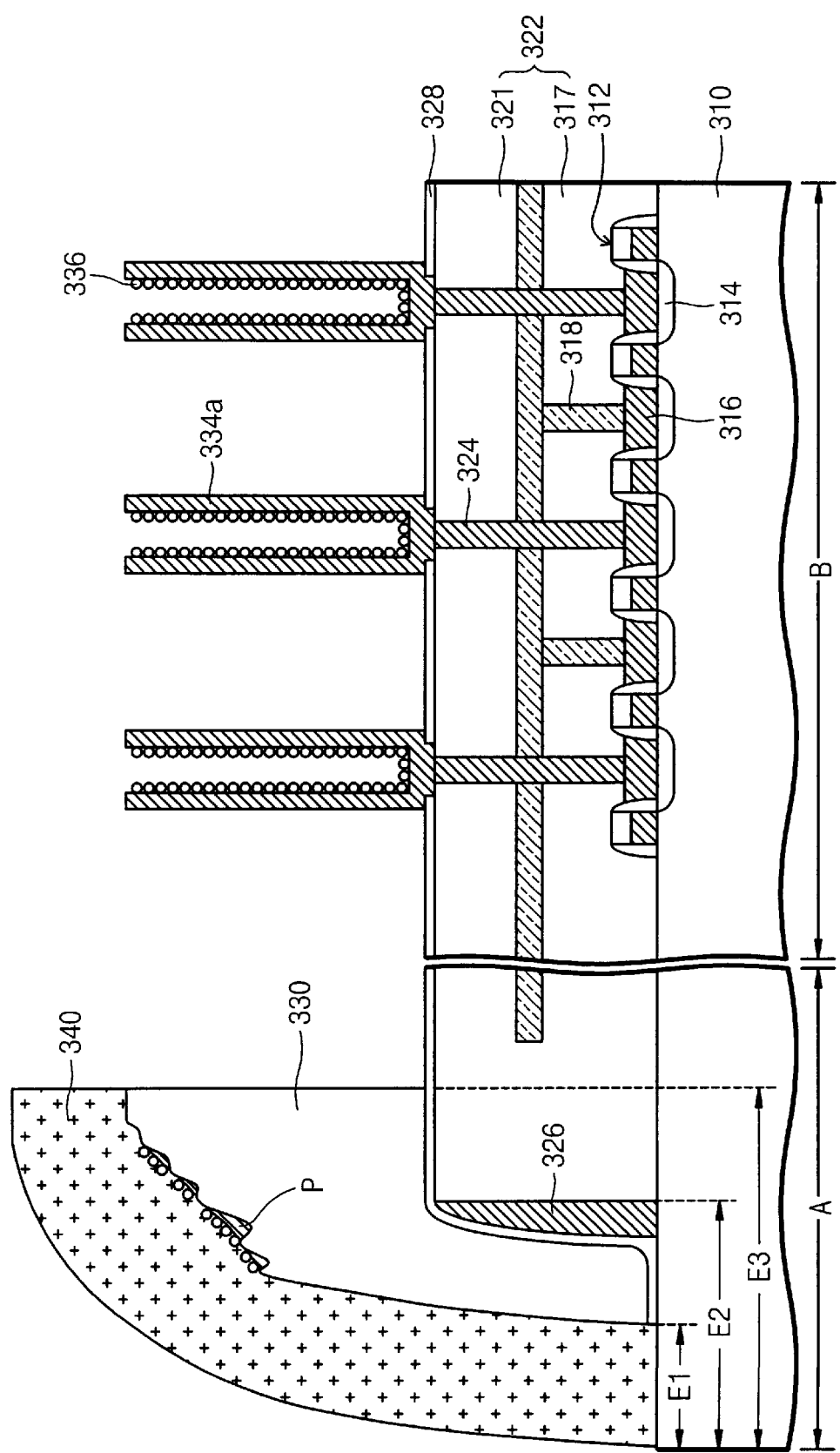

Referring now to FIG. 3D, the second insulating layer 338 and the sacrificial oxide layer 330 exposed by the second photoresist pattern 340 are removed to expose both inner and outer walls of the storage node. The sacrificial oxide at the wafer edge region (A) and outside of the EEW line (at distance E3) can be protected by the second photoresist pattern 340, and is not etched by wet chemicals. Accordingly, the particles P in the rumple surface D can be secured in place between the second photoresist pattern 340 and the remainder of the sacrificial oxide layer 330, thereby preventing the particles from drifting freely to become a source of defects.

The present invention has advantages of removing a defect source in the wafer edge region by removing the defect source. Alternatively, the defect source can be fixed or secured in place thereat, thereby preventing contaminant particles generated from the defect source from drifting freely into a wafer main region during subsequent cleaning processes.

It will be apparent to those skilled in the art that the innovative concepts disclosed in the present application can be applied in a wide variety of contexts. Moreover, the preferred implementation can be modified in a tremendous variety of ways. Accordingly, it should be understood that the modification and variations suggested below and above are merely illustrative. These examples may help to show some of the scope of the inventive concepts, but these examples do not nearly exhaust the full scope of variation in the disclosed novel concepts.

What is claimed is:

1. A method of eliminating a defect source in a wafer edge region for semiconductor fabrication, the wafer being defined by the wafer edge region and a wafer main region, the method comprising:

forming an insulating layer over an entire surface of the wafer, the insulating layer having conductive contaminants in the wafer edge region;

forming a photoresist layer on the insulating layer having the conductive contaminants;

forming a photoresist pattern by removing a selected portion of the photoresist layer to expose a region of the wafer edge region, and while keeping non-wafer edge regions of the wafer covered, removing the exposed conductive contaminants from the wafer edge region by simultaneously removing the exposed conductive contaminants and portions of the insulating layer in a process that leaves at least a portion of the insulating layer intact.

2. The method according to claim 1, wherein the wafer edge region is a ring shaped region with a predetermined width from the outermost part of the wafer edge.

3. A method of fixing a defect source in place in a wafer edge region for semiconductor fabrication, the wafer being defined by the wafer edge region and a wafer main region, the method comprising:

forming an insulating layer over an entire surface of the wafer, the insulating layer having conductive contaminants in the wafer edge region;

forming a photoresist layer on the insulating layer having the conductive contaminants; and forming a photoresist pattern by removing a portion of the photoresist layer in the wafer main region, thereby leaving a region of the wafer edge region covered by the photoresist pattern, to fix the defect source in place therein.

4. A method of eliminating a defect source in a wafer edge region for semiconductor fabrication, the wafer being defined by the wafer edge region and a wafer main region, the method comprising:

forming a first insulating layer over an entire surface of the wafer;

defining a first edge exposure of wafer (EEW) line at a predetermined region of the wafer edge region and removing the first insulating layer outside of the first EEW line;

patterning the first insulating layer to form an opening therein in the wafer main region;

forming a conductive layer on the resultant structure having the opening;

forming a second insulating layer on the conductive layer;

depositing a photoresist layer on the second insulating layer;

defining a second EEW line in the wafer edge region and removing of the photoresist layer outside of the second EEW line to expose a region of the second insulating layer in the wafer edge region;

etching the exposed region of the second insulating layer in the wafer edge region to form a patterned second insulating layer, thereby exposing the conductive layer in the wafer edge region;

removing the photoresist layer; and while the patterned second insulating layer remains positioned on the non-wafer edge region, etching the exposed conductive layer in the wafer edge region using the patterned second insulating layer as an etching mask to simultaneously remove the exposed conductive layer and portions of the insulating layer in a process that leaves at least a portion of the first insulating layer intact.

5. The method according to claim 4, wherein the wafer edge region is a ring shaped region with a predetermined width from the outermost part of the wafer.

6. The method according to claim 4, further comprising growing HSG silicon on the conductive layer.

7. The method according to claim 4, wherein the first EEW line for removing the first insulating layer is formed in the wafer edge region at approximately 1.5 mm from the outermost part of the wafer.

8. The method according to claim 4, wherein the second EEW line for removing the selected portion of the photoresist layer at the wafer region is defined nearer to the wafer main region than the first EEW line for removing the first insulating layer.

9. The method according to claim 8, wherein the second EEW line for the removing the photoresist layer is defined at the wafer edge region of about 3.0 mm from the outermost part of the wafer.

10. The method according to claim 4, wherein the photoresist pattern is formed to a thickness of approximately 1 to 2 micrometer.

11. The method according to claim 4, wherein the conductive layer is made of a conductive material that has an etching selectivity of about 5:1 or more with respect to the first and second insulating layers.

12. The method according to claim 4, further comprising planarizing the second insulating layer and the conductive layer in the wafer main region until the first insulating layer is exposed.

13. A method of fixing a defect source in place in a wafer edge region for semiconductor fabrication, the wafer being defined by the wafer edge region and a wafer main region, the method comprising:

forming a first insulating layer over an entire surface of the wafer;

defining a first edge exposure of wafer (EEW) line in the wafer edge region from an outermost part of the wafer edge and removing the first insulating layer outside of the first EEW line;

forming a first photoresist pattern on the wafer and the first insulating layer;

etching the first insulating layer to form an opening for a storage node in the wafer main region by using the first photoresist pattern as an etching mask;

removing the first photoresist pattern;

forming a conductive layer on the resultant structure having the opening;

forming a second insulating layer on the conductive layer;

planarizing the second insulating layer and the conductive layer until the first insulating layer is exposed;

forming a second photoresist layer over the resultant structure;

defining a second EEW line in the wafer edge region and removing the second photoresist layer inside of the second EEW line, thereby leaving a region of the wafer edge region covered by the second photoresist layer to fix the defect source in place therein.

14. The method according to claim 13, wherein the wafer edge region is a ring shaped region with a predetermined width from the outermost part of the wafer edge.

15. The method according to claim 13, further comprising growing HSG silicon on the conductive layer.

16. The method according to claim 13, wherein the first EEW line for removing the first insulating layer is defined in the wafer edge region at approximately 1.5 mm from the outermost part of the wafer.

17. The method according to claim 13, wherein the second EEW line for removing the second photoresist layer is defined nearer to the wafer main region than the first EEW line for removing the first insulating layer.

18. The method according to claim 16, wherein the second EEW line for removing the second photoresist layer is defined in the wafer edge region at approximately 3.0 mm from the outermost part of the wafer.

19. The method according to claim 13, wherein the second photoresist layer is formed to a thickness of approximately 1 to 2 micrometer.

20. The method according to claim 13, wherein the conductive layer is made of a conductive material that has an etching selectivity of at least 5:1 with respect to the first and second insulating layer.

* * * * *

UNITED STATES PATENT AND TRADEMARK OFFICE
CERTIFICATE OF CORRECTION

PATENT NO. : 6,607,983 B1
DATED : August 19, 2003
INVENTOR(S) : Chun et al.

It is certified that error appears in the above-identified patent and that said Letters Patent is hereby corrected as shown below:

Title page,
Item [74], *Attorney, Agent, or Firm*, "Msrger Johnson" should read -- Marger Johnson --

Column 6,
Line 61, "HF and $H_4F$." should read -- HF and $NH_4F$. --.

Signed and Sealed this

Fourth Day of May, 2004

JON W. DUDAS
*Acting Director of the United States Patent and Trademark Office*